United States Patent

[11] 3,609,414

[72] Inventors Peter Pleshko
Waldwick, N.J.;
Lewis M. Terman, South Salem, N.Y.
[21] Appl. No. 753,923
[22] Filed Aug. 20, 1968
[45] Patented Sept. 28, 1971
[73] Assignee International Business Machines Corporation
Armonk, N.Y.

[54] APPARATUS FOR STABILIZING FIELD EFFECT TRANSISTOR THRESHOLDS
7 Claims, 6 Drawing Figs.

[52] U.S. Cl. .......... 307/310,
307/303, 307/304, 307/264
[51] Int. Cl. .......... H03k 17/14
[50] Field of Search .......... 307/310,
303, 304, 309; 330/69

[56] References Cited

UNITED STATES PATENTS

| | | | |
|---|---|---|---|
| 3,213,299 | 10/1965 | Rogers | 307/303 |
| 3,283,576 | 11/1966 | Halpin | 307/310 |
| 3,290,520 | 12/1966 | Wennik | 330/69 |
| 3,308,271 | 3/1967 | Hilbiber | 307/310 |
| 3,395,265 | 7/1968 | Weir | 307/310 |
| 3,441,748 | 4/1969 | Werner | 307/237 |

*Primary Examiner*—Donald D. Forrer
*Assistant Examiner*—Harold A. Dixon
*Attorneys*—Hanifin and Clark and Thomas J. Kilgannon, Jr.

ABSTRACT: Apparatus is disclosed which permits the adjustment and stabilization of field effect transistor threshold voltages so that the variation in threshold voltages due to fabrication nonuniformities are reduced to a minimum. This is accomplished by utilizing one of a plurality of field effect devices on a semiconductor chip as a sensor to detect changes in the characteristics of the devices, from whatever cause. A feedback circuit provides a signal which adjusts the voltage applied to the semiconductor chip or substrate and returns the threshold voltage to some nominal value. Several circuit arrangements are shown which accomplish the desired result. A plurality of chips each having a sensor and associated feedback circuitry is also disclosed indicating the environment in which the concept of the present invention is used most advantageously.

INVENTORS
PETER PLESHKO
LEWIS M. TERMAN

BY Thomas J. Kilgannon Jr
ATTORNEY

APPARATUS FOR STABILIZING FIELD EFFECT TRANSISTOR THRESHOLDS

BACKGROUND OF THE INVENTION

1. Field of the Invention

This invention relates generally to control and stabilization techniques which utilize negative feedback to set the operating point of transistor devices. More specifically, it relates to the adjustment and stabilization of the thresholds of a plurality of field effect transistors disposed on a semiconductor chip by control of the substrate voltage which is applied to the chip. Control of the substrate or chip voltage is accomplished by incorporating negative feedback techniques. As a result, a plurality of chips may be utilized in a system which, because of the individual chip adjustment and stabilization of threshold voltages, eases design parameters relative to voltage limits, increases the yield of useable chips and substantially reduces the overall costs of fabrication and assembly of systems which incorporate semiconductor chips containing a plurality of field effect transistors.

2. Description of the Prior Art

Classical feedback arrangements which utilize a variation in some electrical quantity (voltage, current, resistance) to control the operation of a device, circuit, or system, are so well known that further consideration other than to mention them is believed to be unnecessary. Most of the known techniques utilize some sensing arrangement which senses a variation in a given parameter, inverts, amplifies, and feeds back the output of the sensor to directly control a certain device in a desired way. However, difficulties are encountered if it is attempted to control the operation of a plurality of individual devices in this manner. Individual control of each device, requiring separate sensing, inverting, amplifying, and feedback arrangements for each device is clearly uneconomical. Also, there is little advantage in attempting to control the operation of a plurality of individual devices by a single common sensing and feedback means, since characteristics vary considerably on a device-to-device basis. Thus, selecting an individual device as representative of all other devices in the plurality, and applying the same feedback signal to all other devices which adjusts the characteristics of the selected sensing device to desired values does not insure that the characteristics of these devices will be brought to the same value, since the feedback does not necessarily reduce the spread in the initial values of the characteristics. Thus, a common feedback arrangement will have the effect of shifting the characteristics of all devices, but not reducing the overall spreads in these characteristics. In other words, unless the devices sought to be controlled have substantially identical characteristics, feeding back an error signal will not provide control but merely a uniform shift of characteristics.

When a number of chips containing a plurality of field effect transistors is required in a system, the prior art has chosen to set rather wide limits on given characteristics such as threshold voltage, to insure proper operation of the overall system. This results in a system which is comparatively uneconomical, cumbersome, inefficiently designed, and poorly controlled. In the specific area of field effect transistors, there is no known prior art which seeks to control the characteristics of a plurality of field effect transistors on a chip by controlling the voltage applied to the substrate as a result of sensing a variation in a characteristic of a sensor device located on the chip; the sensor being truly representative of each of the plurality of field effect transistors.

SUMMARY OF THE INVENTION

The apparatus of the present invention in its broadest aspect comprises a semiconductor substrate or chip; a plurality of field effect transistors (hereinafter called FET's) disposed thereon, a sensing transistor which is selected from one of the available plurality of FET's which is representative of the other devices on the chip; feedback means connected to said sensing means and to the substrate which provides an output signal which is applied to the substrate. The variations in output signal are applied to the substrate which, in turn, adjusts the thresholds of the plurality of transistors to some preselected value.

In accordance with a more specific aspect of the invention, an FET device which has been previously fabricated on a semiconductor substrate or chip is selected and it is assumed to have characteristics substantially representative of all of the other FET devices on the chip. It should be appreciated at this point that experimental evidence indicates that a device characteristic such as threshold voltage varies by a relatively small amount between devices on the same chip. Variations in the same characteristics on a chip-to-chip basis are much wider. With respect to threshold voltages, the wider variation on a chip-to-chip basis results from differences in oxide charge, oxide thickness during fabrication and to a smaller extent to changes in resistivity of the chip due to variations in resistivity which occur during growth of the crystal from which the chips are cut. Also, aging of the devices after fabrication is another reason for a change in characteristics. The chip or semiconductor substrate is, therefore, the basic unit in which the characteristics of individual devices can be said to be substantially the same and in which it can be assumed that all are subjected to the same conditions which cause device characteristics to change. The utilization of an FET on the chip as a sensor to detect changes in other device characteristics as a result in changes in its own characteristics eliminates the necessity for individual control of device characteristics and, where threshold voltage is the characteristic to be controlled, the characteristic can be controlled by adjustment of the substrate voltage.

Thus, if sensing is accomplished by virtue of a change in current through the sensing FET, this change can be determined by detecting a voltage change in a dropping resistor, comparing that voltage with a reference voltage in a differential amplifier or other similar circuitry and providing therefrom an output voltage which is applied to the substrate or chip. The change in substrate voltage affects the threshold voltages of the individual devices on the chips and maintains each threshold value substantially constant. From the foregoing, it should be clear that the voltage applied to an individual chip or substrate can be adjusted to any desired value and that the thresholds can likewise be adjusted to any desired level by changing the substrate voltage. As a result, each substrate or chip can be made to have, to all intents and purposes, identical characteristics, and the overall threshold voltage spread of a group of chips, which formerly was uncontrolled, is now closely controlled and the threshold voltage spread of the group is adjusted to the smaller on chip threshold voltage spread. Thus, threshold voltages which could be quite different when a single substrate voltage was applied to all chips can now be made the same by individually applying appropriate and different substrate voltages to each substrate or chip. By forcing the threshold voltages of separate chips to a common value by applying different voltages to each substrate, the overall threshold voltage spread is reduced to the smaller device-to-device on chip spread, since the threshold voltage spreads are substantially the same regardless of the value of substrate voltage applied.

It is, therefore, an object of this invention to provide a method and apparatus which reduces the overall threshold voltage spread of a plurality of chips or substrates each containing a plurality of FET's to the smaller device-to-device on chip threshold voltage spread.

Another object is to provide method and apparatus which stabilizes the thresholds of pluralities of FET devices on a number of chips to a constant value by individually tailoring the substrate voltages applied to each chip.

Still another object is to provide method and apparatus which permits design criteria to be established which fall within narrower limits than previously obtainable.

Yet another object is to provide method and apparatus which permits the utilization in systems of semiconductor substrates which have wide variations in characteristics thereby materially enhancing the economic feasibility of FET utilization in such systems.

The foregoing and other objects, features and advantages of the invention will be apparent from the following more particular description of a preferred embodiment of the invention as illustrated in the accompanying drawings.

DESCRIPTION OF A PREFERRED EMBODIMENT

Figure 1:
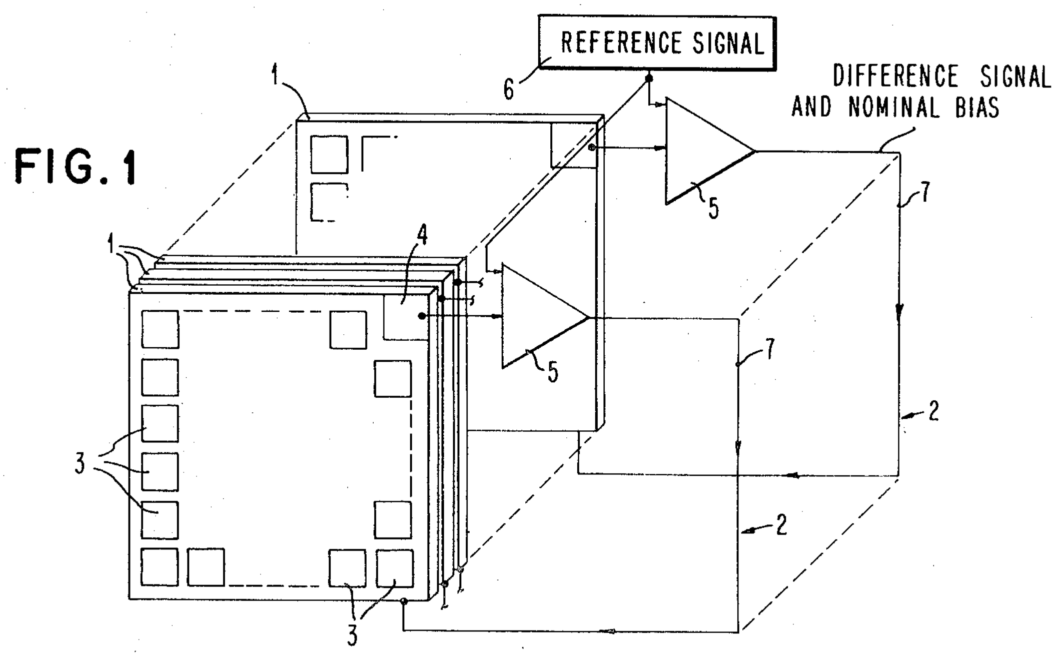
FIG. 1 is a partial schematic block diagram of the threshold voltage stabilization apparatus in accordance with the present invention showing sensor and feedback arrangements which control the substrate voltages applied to a plurality of chips to maintain the threshold voltage of all devices on the chips substantially constant.

Referring now to FIG. 1, there is shown a partial schematic block diagram of a plurality of semiconductor chips or substrates 1 and their associated feedback paths 2. Each semiconductor chip 1 has disposed thereon a plurality of FET's 3, all of which have substrate 1 in common. FET devices 3 are fabricated by techniques well known to those skilled in the integrated circuitry art and will be discussed in some detail hereinbelow. Each chip 1 contains a sensor transistor 4 which may be any one of the plurality of FET devices 3. Each sensor transistor 4 is representative of all devices 3 on its associated chip 1 and, with respect to a characteristic such as threshold voltage, it falls within the relatively narrow spread of threshold voltages which differ slightly from device to device on a given chip and results from fabrication differences and other causes. It should be appreciated, at this point, that each of the chips 1 of FIG. 1 can be quite different from any other chip due to variations in resistivity during growth, oxide charge, oxide thickness variation during fabrication and other causes. Applying the same substrate voltage to each of chips 1 will, of course, result in a different threshold voltage due to the above mentioned variations. If this approach is chosen, that is, without stabilization of threshold voltages, circuits associated with each of the chips must be designed taking into account the extremes in threshold voltages which result from the differences inherent in each chip. To overcome the resulting problems, the combination of sensor transistors 4 and feedback paths 2 may be utilized to apply different voltages to substrates or chips 1 to obtain substantially the same threshold voltage for devices 3 on each of chips 1.

In FIG. 1 each of feedback paths 2 includes a differential amplifier 5, one input terminal of which is connected to each sensor transistor 4 and the other input terminal of which is connected to a common reference signal source 6. The output terminal of amplifier 5 is connected to each of substrates 1 via interconnection 7. The feedback signals consist of a difference signal plus a nominal bias voltage.

In operation, the semiconductor chips 1 of FIG. 1, in a quiescent state, have nominal biases applied thereto via interconnections 7. If the threshold voltages of the chips are different from a desired value, from whatever cause, these differences will be reflected in the departure from a chosen preselected value of the current flow through the sensor transistor 4. For purposes of explanation, it can be assumed that the output of sensor transistor 4 is represented by a change in voltage. This changing voltage is applied to differential amplifier 5 where it is compared with a reference signal; in this instance, a voltage from reference signal source 6. Differential amplifier 5 may be any one of a number of devices well known to those skilled in the electronics art. The output of differential amplifiers 5 is a difference signal which is superimposed on a nominal bias. This composite signal is fed back via interconnections 7 to each of substrates 1 as substrate voltages which in turn adjust the threshold voltages of each of the sensor transistors to the desired value. Since all devices on a given chip have substantially the same threshold voltage, adjustment of the sensor devices threshold to a given value will result in essentially all devices in the chip having threshold voltages at the same value. It should be appreciated that the resulting substrate voltages applied to chips 1 may all be different so that a nominal threshold voltage which is the same for every chip is obtained.

Figure 2:
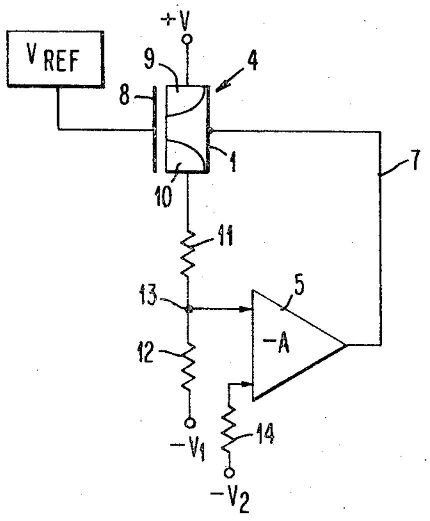
FIG. 2 is a schematic diagram of a circuit arrangement which adjusts the voltage applied to a common substrate to maintain the threshold voltage of an FET device which is representative of a plurality of FET devices substantially constant.

Referring now to FIG. 2, there is shown a schematic diagram of a feedback path and sensor transistor which may be utilized in the practice of the present invention. The reference numbers of FIG. 1 have been utilized in FIG. 2 where the elements in both figures are similar. The FET's shown in FIG. 2 and in the succeeding figures are shown as N-channel devices for purposes of explanation. It should be clear, however, that P-channel devices can also be utilized by simply reversing the polarities of the voltages shown in the FIGS.

In FIG. 2, sensor transistor 4 is shown having its gate electrode 8 connected to a source of voltage $V_{REF}$; its drain 9 connected to a positive voltage +V and; its source 10 connected to a negative voltage $-V_1$ via resistors 11, 12. Substrate 1 of sensor transistor 4 is connected via interconnection 7 to the output of a differential amplifier 5. One input connection to amplifier 5 is connected to a point 13 intermediate resistors 11, 12 and the other input terminal is connected to a negative voltage $-V_2$ which is the same as source 6 in FIG. 1 via a resistor 14.

In operation, the circuit of FIG. 2 adjusts the voltage applied via interconnection 7 to substrate 1 so that the threshold of sensor transistor 4 is maintained substantially constant and at a value determined by $V_{REF}$. Substrate 1 is, of course, common to a plurality of FET's and, though not specifically shown in FIG. 2, it should be appreciated that the threshold voltages of all FET's having substrate 1 in common are substantially the same.

In FIG. 2, $V_{REF}$ is adjusted so that in conjunction with a given threshold voltage, sensor transistor 4 conducts a given current. The current through sensor transistor 4 depends upon the difference between the voltage $V_{REF}$ on gate 8 of sensor transistor 4 and the threshold voltage of transistor 4. Current through transistor 4 passes current through resistors 11, 12. The resistance of resistor 12 provides a desired voltage at point 13 which is applied to one input terminal of differential amplifier 5. A comparison is made within amplifier 5 with the voltage resulting from the combination of resistor 14 and voltage $-V_2$. The latter voltage is similar to that supplied by reference signal source 6 in FIG. 1. If there is no difference between the compared voltages, the output to substrate 1 via interconnection 7 is zero or is unchanged from a bias voltage which is normally applied to substrate 1 to establish a threshold voltage for sensor transistor 4. If a difference exists, the difference is fed back via interconnection 7 to substrate 1 with the proper polarity to counter the change which initially appeared as a change in current through sensor transistor 4. Thus, assume the threshold of sensor transistor 4 to be such that sensor transistor 4 is in the ON condition. A change in the trheshold which would tend to turn transistor 4 OFF is reflected in a reduction in current through transistor 4 and resistors 11, 12. The reduction in current reduces the voltage drop across resistor 12 so that the voltage at point 13 approaches $-V_1$. Thus, an increasing negative voltage is seen at point 13. The voltage at point 13 is applied to amplifier 5 and compared with the voltage $-V_2$ which is a reference voltage. Because of the negative gain characteristics of amplifier 5, the resulting output is a decreasing value of negative voltage which when applied to substrate 1 via connection 7 appears as a less negative voltage on substrate 1. A less negative voltage on substrate 1 is reflected in a reduction in the threshold of the device countering the initial condition which tended to increase the threshold voltage of sensor transistor 4.

Figure 3:
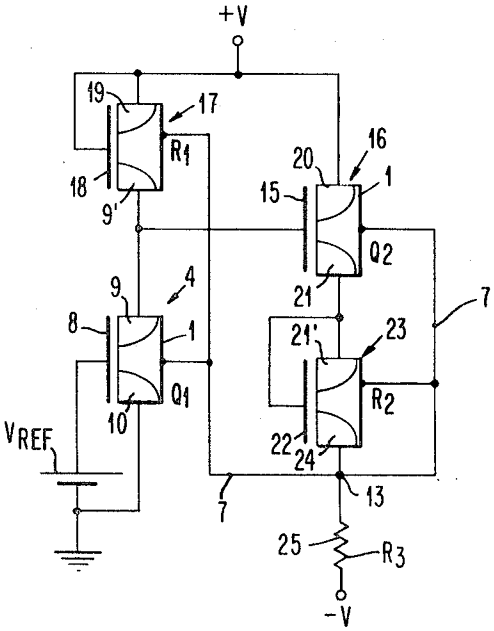
FIG. 3 is a schematic diagram of a control and stabilization circuit which utilizes FET's both as active and passive devices.

Turning now to FIG. 3, there is shown therein an embodiment of the present invention which is practically realizable using integrated circuit techniques and, in which all devices, both active and passive, are formed in or at the surface of a semiconductor chip. Also, all the devices, with the exception of a dropping resistor are realizable in the form of FET devices. Where possible, the same reference numeral used in FIGS. 1 and 2 have been used to identify the same elements in FIG. 3.

In FIG. 3, sensor transistor 4 is also identified as $0_1$. A source of reference voltage identified as $V_{REF}$ is shown connected to the gate 8 of transistor 4. The source 10 of transistor 4 is grounded while drain 9 thereof is connected to the gate 15 of an FEET 16, also identified as transistor $0_2$, and to the source 9' of an FET 17, also identified as $R_1$, which is utilized as a resistive load. The gate 18 and drain 19 of FET 17 and the drain 20 of transistor $Q_1$ are connected in parallel to a voltage +V. Source 21 of transistor $0_2$ is connected to the drain 21' and gate 22 of FET 23, also identified as $R_2$, which is utilized as a resistive load in the circuit of FIG. 3. The source 24 of FET 23 is connected to a node or point 13 which is connected via interconnections 7 to the substrates 1 of transistors $Q_1$, $Q_2R_1$and $R_2$. A voltage source identified as $-V$ is connected via resistor 25 also identified as $R_3$, to point 13.

The circuit of FIG. 3 just described operates in the following manner.

A voltage is applied to the substrate of transistor $Q_1$ via interconnection 7 from node 13. The voltage at node 13 differs from $-V$ by the voltage drop across resistor $R_3$ which in turn is determined by the current flowing in transistor $Q_2$. The current through transistor $Q_2$ is a function of the voltage on gate 15 of transistor $Q_2$. This latter voltage is, in turn, dependent upon the voltage drop across resistive load $R_1$. The voltage drop in resistive load $R_1$ is determined by the current flow through sensor transistor $Q_1$. This last mentioned current depends upon the difference between $V_{REF}$, reference source 6 and the threshold voltage of transistor $Q_1$.

The proper threshold voltage is obtained by designing the difference between $V_{REF}$ and the threshold voltage such that enough current flows through $Q_1$ to provide the proper bias at point 13 which is connected to the substrate. A change in the trheshold of $Q_1$ results in a change in the current through $Q_1$ and therefore, in $Q_2$, which causes point 13 to assume a new potential, thereby changing the substrate voltage on $Q_1$ in a manner which counteracts the original change in voltage.

Thus, any increase in the threshold of $Q_1$ results in a reduction in current through $R_1$ thereby driving the voltage on gate 15 toward the voltage +V. The higher voltage on gate 15 of $Q_2$ permits a higher current to flow in the series path consisting of $Q_2$, $R_2$ and $R_3$. The higher current causes a higher voltage drop in resistor $R_3$ making the voltage at point 13 less negative. A less negative voltage applied to substrate 1 reduces the threshold thereby counteracting the initial change which tended to increase the threshold. Similarly, a reduced threshold is counteracted by increasing the substrate voltage, again counteracting the initial change which tended to increase the threshold.

Figure 4A:
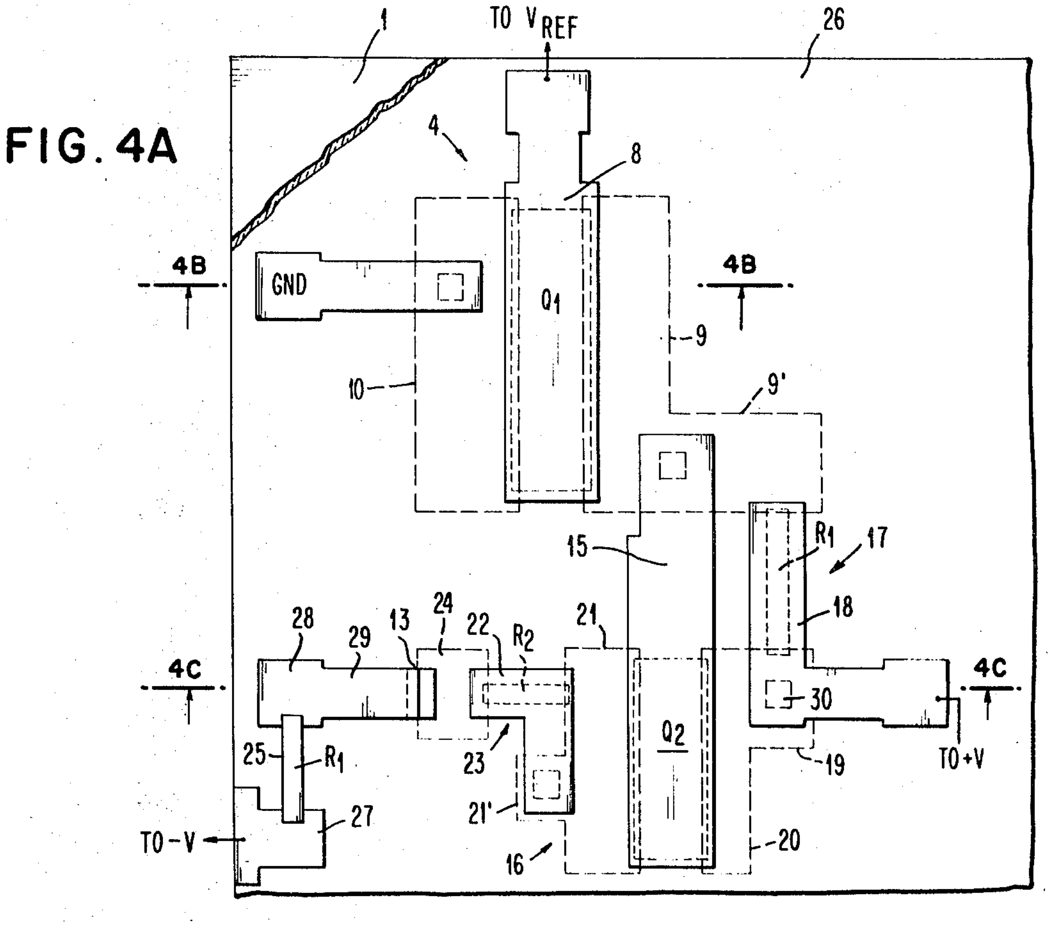
FIG. 4A is a plan view of a portion of a semiconductor chip showing the actual layout of the circuit of FIG. 3 in the semiconductor environment.
Figure 4B:
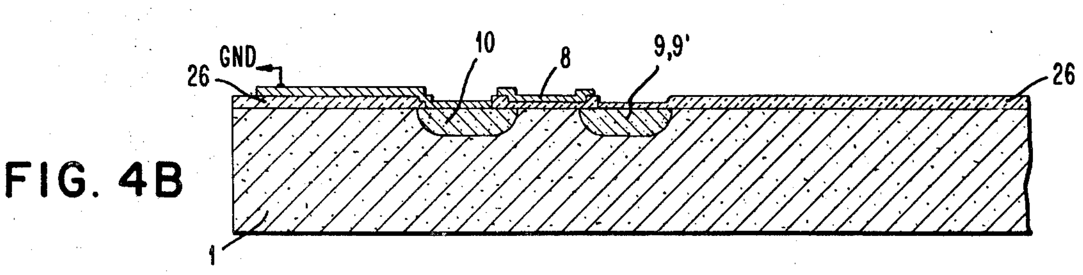
FIG. 4B is a cross-sectional view taken along lines 4B—4B is FIG. 4A showing the interrelationship of the diffusions, insulation and metallization of an FET device.
Figure 4C:
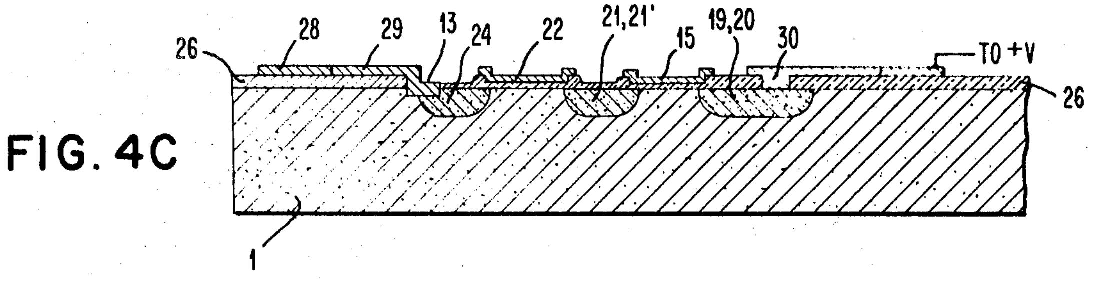
FIG. 4C is a cross-sectional view taken along lines 4C—4C in FIG. 4A showing the utilization of FET's as active and passive devices and their associated interconnections.

The circuit of FIG. 3 is shown in FIG. 4A in plan as it appears when fabricated by integrated circuit techniques. In FIG. 4A, FET's $Q_1$ and $Q_2$ and resistors $R_1$ and $R_2$ are shown formed in a semiconductor substrate 1. Semiconductor substrate or chip 1 may be any one of the known semiconductors such as silicon, germanium or gallium arsenide. Semiconductor substrate 1 is usually obtained from a slice of a grown single crystal which has been cut into chips of substantially uniform size. The semiconductor chip is doped with well-known dopants to exhibit either a p or n conductivity type. For purposes of the following description, semiconductor substrate 1 is assumed to be P-conductivity type. The FET devices 4, 16, 17 and 23 are formed by diffusing source and drain regions of opposite conductivity type into semiconductor substrate 1. This is accomplished by depositing or growing a layer 26 of insulating material such as silicon dioxide on the surface of semiconductor wafer 1. Then using well-known photolithographic techniques, a pattern is etched through the insulating material to expose the surface of substrate 1. Substrate 1 is then placed into a diffusion furnace where a selected N-type impurity is diffused into substrate 1 to a desired depth by heating at appropriate temperatures for a given time. All the diffusions required are carried out simultaneously The diffusions are shown in FIG. 4A by the long dashed lines. FIG. 4B and 4C show the diffusions in cross section. Thus, in FIG. 4A, diffusions 10 and 9 are the source 10 and drain 9 of transistor $Q_1$ shown in FIG. 3. Diffusions 9' and 19 are the source 9' and drain 19, respectively, of resistor $R_1$ shown in FIG. 3. Diffusions 21 and 20 are the source 21 and drain 20 of transistor $Q_2$ shown in FIG. 3. Diffusions 21' and 24 are the drain 21' and the source 24, respectively, of resistor $R_2$ shown in FIG. 3. It should be noted that while diffusions 9, 9' and 21 and 21' are shown as separate portions of individual devices in FIG. 3, and have separate reference numbers in FIG. 4A, these diffusions are fabricated as a single diffusion since electrically they are at the same potential. Diffusions 19 and 20 are electrically at the same potential and though shown separately in FIG. 3, they are fabricated as a single diffusion and are so shown in FIG. 4A.

After the desired diffusions are fabricated, an insulating film of silicon dioxide is regrown on the exposed surface of the semiconductor chip 1 to cover over the opening through which the diffusions were made. Again using well-known photolithographic techniques, the regrown oxide is removed from the surface of semiconductor 1 at the regions between the diffusions. A thin insulating layer of silicon dioxide is then grown in the regions between the diffusions to form the gate oxide regions. These thin gate oxide regions are shown in FIG. 4A bounded by short dashed lines. The gate oxide regions are shown in cross section in FIGS. 4B and 4C beneath gate electrodes 8, 15 and 22. At this point, the surface over each of the diffusions, if required, is exposed using the well-known photolithographic techniques to provide holes through which contacts can be applied to the diffusions. Metal is then deposited by evaporation or other suitable technique over the entire surface of substrate 1. By subtractively etching the deposited metal after photolithographic masking, interconnections and contacts are defined. Thus, in FIG. 4A, gate metallizations 8, 15, 18 and 22 are shown which correspond to gates 8, 15, 18 and 22 in FIG. 3. Other metallizations while not specifically labeled in FIG. 4A corresponding to interconnections which couple voltages to substrate 1 from sources off substrate 1. These interconnections may be identified in FIG. 4A by the legends: TO $-V$ to =V and TO $V_{REF}$ and correspond to similar legends in FIG. 3. Thus, in FIG. 4A, the voltage $-V$ is connected via metallic pad 27 to resistor $R_3$ which is a deposited resistive film tailored to provide a desired value of resistance. Resistor $R_3$ is connected to another metallic pad 28 which extends via metallization 29 to form a contact 13 which short circuits diffusion 24 to substrate 1. In this way, the voltage appearing at contact 13 is electrically coupled to substrate 1. FIG. 4C shows a cross-sectional view of contact 13 shorting diffusion 24 to substrate 1. From this, it should be clear that all the devices on the chip 1 have a common substrate voltage. Metal contact 30 to diffusion 19, 20 in FIG. 4C shows an ohmic contact normally applied to a diffusion.

The arrangement shown in FIG. 4A operates in the same manner as the circuit of FIG. 3. Thus, the voltage applied to substrate 1 is that voltage appearing at contact 13 in FIGS. 3 and 4A and that voltage is adjusted by the interaction of the other devices on the chip to maintain the threshold voltages of all the devices on the chip substantially constant.

In connection with FIG. 4A, it should be appreciated that only a small portion of a chip containing circuitry to maintain the thresholds of the other FET devices 3 (not shown) has been shown. The fact that only a portion of the chip or substrate is required is clearly demonstrated in FIG. 1, which shows a plurality of FET devices 3 in addition to sensor transistor 4 and feedback path 2. The only differences between FIG. 1 and FIG. 4A are that the elements making up feedback path 2 are shown on the chip 1 and the plurality of FET devices 3 are not shown. The substrate voltage applied via point 13 in FIG. 4A also sets the threshold voltage of devices 3 and any adjustment in the substrate voltage is reflected by an adjustment of all devices on chip or substrate 1.

Typical voltages applied to the circuit of FIG. 3 are as follows:

| | | |
|---|---|---|
| $R_1$ = 45 K ohms | +V = 30 v. | Substrate $\rho$ = 2.3 Ω cm. |
| $R_2$ = 30 K ohms | −V = 30 v. | Nominal threshold = 2.5 v. |
| $R_3$ = 45 K ohms | $V_{REF}$ = 3 v. | Nominal V substrate = −7.0 v. |
| | | $\frac{\Delta V \text{ threshold}}{\Delta V \text{ substrate}} = \frac{1}{6}$ |

While the invention has been particularly shown and described with reference to preferred embodiments thereof, it will be understood by those skilled in the art that the foregoing and other changes in form and details may be made therein without departing from the spirit and scope of the invention.

What is claimed is:

1. Stabilization and control apparatus comprising;
a semiconductor substrate containing a plurality of field effect transistors,
a source of voltage coupled to said substrate to establish a desired value of threshold voltage for each of said plurality of field effect transistors,
sensing means integral with said substrate for detecting a departure from said desired value of threshold voltage, and
means responsive to said sensing means for adjusting said voltage source to maintain said threshold voltage at said desired value.

2. Stabilization and control apparatus comprising;
a semiconductor substrate containing a plurality of field effect transistors,
means for applying a voltage to said substrate to establish a desired value of threshold voltage, and
means including at least a field effect transistor integral with said substrate having characteristics representative of said plurality of field effect transistors for counteracting a departure from said desired value of threshold voltage connected to said means for applying voltage.

3. Stabilization and control apparatus according to claim 2 wherein said means for counteracting includes,
a reference voltage connected to said at least a field effect transistor which coacting with said means for applying a voltage to said substrate controls the flow of current through said at least said field effect transistor,
means connected to said transistor for detecting a change in current through said transistor by a corresponding voltage drop,
comparison means including another reference voltage coupled to said means for detecting to compare said voltage drop with said another reference voltage to provide an output voltage when said voltage drop and said another voltage differ, and
means interconnecting said comparison means and said means for applying a voltage to said substrate to apply said output voltage to said substrate.

4. Stabilization and control apparatus comprising;
a plurality of semiconductor substrates each containing a plurality of field effect transistors,
a plurality of voltage sources each coupled to a respective substrate to establish a desired value of threshold voltage for each plurality of field effect transistors,
sensing means integral with each said substrate for detecting a departure from said desired value of threshold voltage, and
means responsive to each said sensing means for adjusting each of said plurality of voltage sources to maintain said threshold voltage of each of said substrates at said desired value.

5. Stabilization and control apparatus comprising;
a plurality of semiconductor substrates each containing a plurality of field effect transistors each substrate differing from all others electrically,
means for applying a voltage to each of said plurality of substrates to establish a desired value of threshold voltages for all the pluralities of field effect transistors, and
means including at least a field effect transistor integral with each said substrate having characteristics representative of its associated plurality of transistors for counteracting a departure from said desired value of threshold voltage connected to each said means for applying voltage.

6. Stabilization and control apparatus according to claim 5 wherein each said means for counteracting includes,
a reference voltage connected to said at least a field effect transistor which coacting with said means for applying a voltage to said substrate controls the flow of current through said at least said field effect transistor,
means connected to said transistor for detecting a change in current through said transistor by a corresponding voltage drop,
comparison means including a common reference voltage source coupled to each said means for detecting to compare said voltage drop with said common reference voltage to provide an output voltage when said voltage drop and said common reference voltage differ, and
means interconnecting said comparison means and said means for applying a voltage to said substrate to apply said output voltage to its associated substrate.

7. Stabilization and control apparatus comprising:
a plurality of substrates each containing a plurality of field effect transistors each substrate having electrical characteristics different from all others,
means for applying a voltage to each of said substrates,
a sensing transistor integral with each of said substrates said sensing transistor being characteristic of each of its associated plurality of field effect transistors,
a reference voltage electrically coupled to each said sensing transistor to establish a given threshold voltage,
a voltage source and a resistance disposed in series with each said sensing transistor,
a field effect transistor connected to each said voltage source the gate electrode of which is connected between said sensing transistor and said resistance to apply a voltage to said gate electrode inversely proportional to the current through said sensing transistor, and
another resistance connected in series with each said field effect transistor and with said means for applying a voltage to each of said substrates, the current flow through said another resistance being directly proportional to the voltage on said gate of said field effect transistor said current flow through said means for applying a voltage resulting in the variation of said means for applying a voltage to each said substrate.